United States Patent
Tan et al.

(10) Patent No.: US 12,354,830 B2
(45) Date of Patent: Jul. 8, 2025

(54) SAMPLE IMAGE DISPLAY SYSTEM AND CHARGED PARTICLE BEAM APPARATUS

(71) Applicant: Hitachi High-Tech Corporation, Tokyo (JP)

(72) Inventors: Wei Chean Tan, Tokyo (JP); Hiroyuki Chiba, Tokyo (JP); Ryo Komatsuzaki, Tokyo (JP); Hirofumi Sato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 703 days.

(21) Appl. No.: 17/640,210

(22) PCT Filed: Sep. 4, 2019

(86) PCT No.: PCT/JP2019/034781
§ 371 (c)(1),
(2) Date: Mar. 3, 2022

(87) PCT Pub. No.: WO2021/044544
PCT Pub. Date: Mar. 11, 2021

(65) Prior Publication Data
US 2022/0336184 A1  Oct. 20, 2022

(51) Int. Cl.
*H01J 37/22*  (2006.01)
*G01N 23/2251*  (2018.01)

(52) U.S. Cl.
CPC ........ *H01J 37/222* (2013.01); *G01N 23/2251* (2013.01)

(58) Field of Classification Search
CPC .............. H01J 37/222; H01J 2237/221; G01N 23/2251

USPC .................................................. 250/306, 307
See application file for complete search history.

(56) References Cited

U.S. PATENT DOCUMENTS

| | | | |
|---|---|---|---|
| 2003/0007677 A1* | 1/2003 | Hiroi | G06T 7/001 |
| | | | 382/149 |
| 2004/0038454 A1 | 2/2004 | Coldren et al. | |
| 2004/0228515 A1* | 11/2004 | Okabe | G06T 7/0004 |
| | | | 382/145 |
| 2005/0285034 A1* | 12/2005 | Tanaka | H01J 37/28 |
| | | | 250/307 |
| 2007/0194231 A1 | 8/2007 | Nakahira et al. | |
| 2007/0226634 A1 | 9/2007 | Hirai | |
| 2019/0279838 A1 | 9/2019 | Shigeto et al. | |

(Continued)

FOREIGN PATENT DOCUMENTS

| JP | 7-92094 A | 4/1995 |
|---|---|---|
| JP | 2004-134758 A | 4/2004 |

(Continued)

OTHER PUBLICATIONS

International Search Report (PCT/ISA/210) issued in PCT Application No. PCT/JP2019/034781 dated Dec. 3, 2019 with English translation (four (4) pages).

(Continued)

*Primary Examiner* — Kiet T Nguyen
(74) *Attorney, Agent, or Firm* — Crowell & Moring LLP

(57) ABSTRACT

A sample image display system 150 displays, on a screen, a plurality of images 203 of a sample S and a symbol 205 corresponding to each of the images. The sample image display system 150 displays each symbol 205 in a different mode according to information related to the corresponding image 203.

13 Claims, 14 Drawing Sheets

(56) References Cited

U.S. PATENT DOCUMENTS

2020/0161087 A1* 5/2020 Abe .................. G06F 3/04845
2020/0278303 A1 9/2020 Tada et al.

FOREIGN PATENT DOCUMENTS

| JP | 2007-225351 A | 9/2007 |
| JP | 2007-232480 A | 9/2007 |
| JP | 2008-53609 A | 3/2008 |
| JP | 2014-229587 A | 12/2014 |
| JP | 2015-220296 A | 12/2015 |
| JP | 2016-81878 A | 5/2016 |
| JP | 2019-60741 A | 4/2019 |
| JP | 2019-87369 A | 6/2019 |
| WO | WO 2018/096575 A1 | 5/2018 |

OTHER PUBLICATIONS

Japanese-language Written Opinion (PCT/ISA/237) issued in PCT Application No. PCT/JP2019/034781 dated Dec. 3, 2019 (eight (8) pages).
International Preliminary Report on Patentability (PCT/IB/338 & PCT/IPEA/409) issued in PCT Application No. PCT/JP2019/034781 dated May 25, 2021 (10 pages).
Japanese-language Office Action issued in Japanese Application No. 2021-543860 dated Nov. 22, 2022 with English translation (nine (9) pages).

* cited by examiner

[FIG. 1]
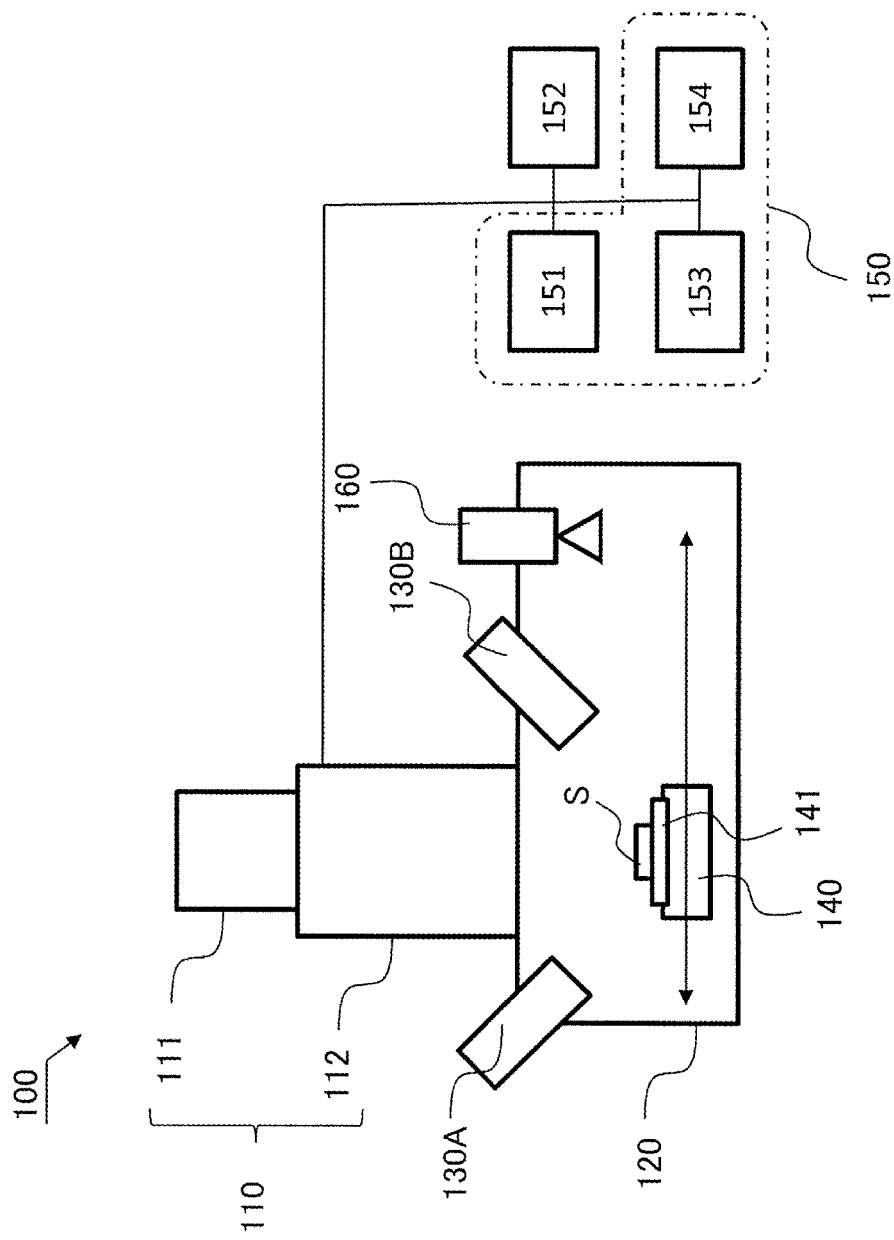

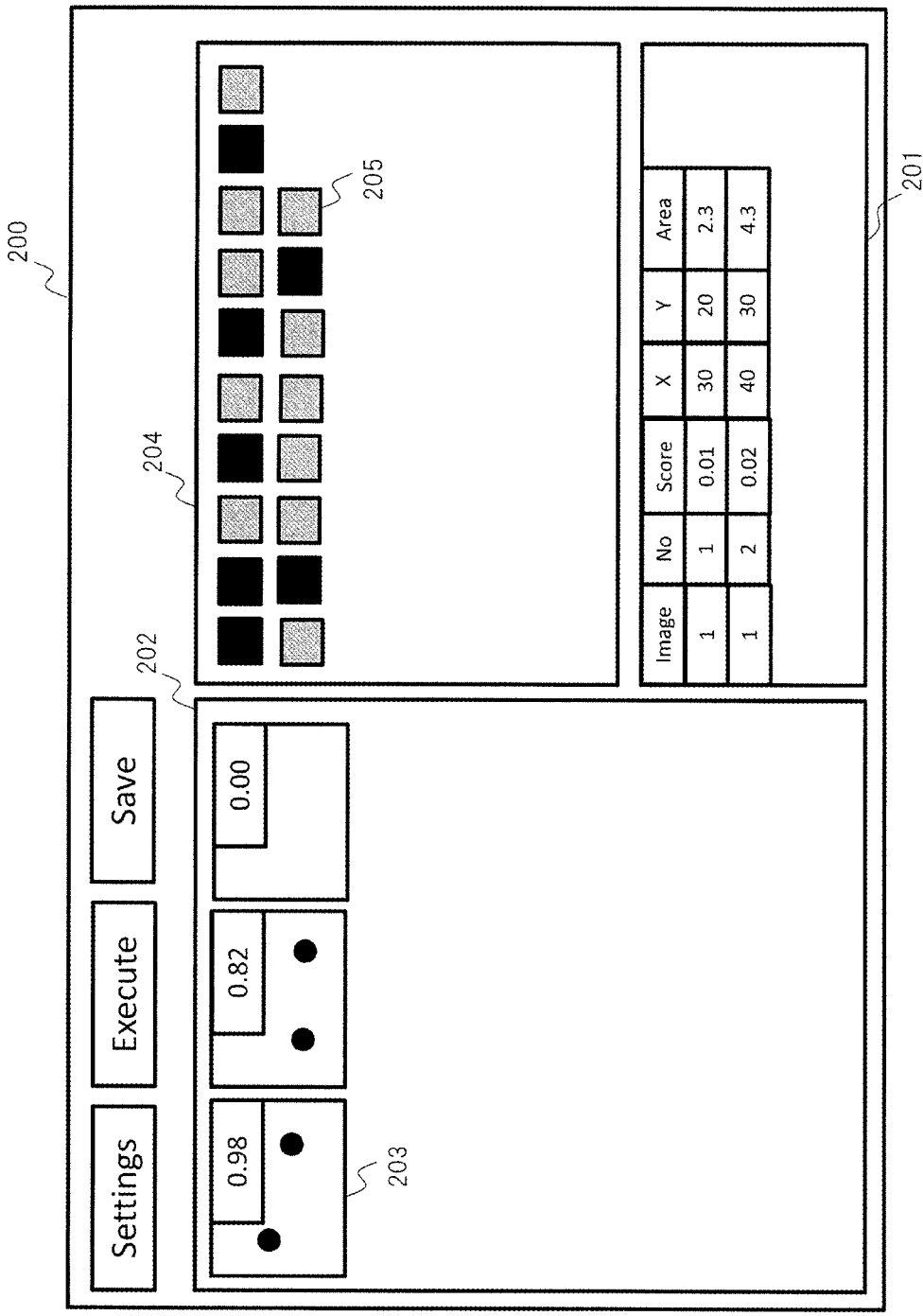
[FIG. 2]

[FIG. 3]
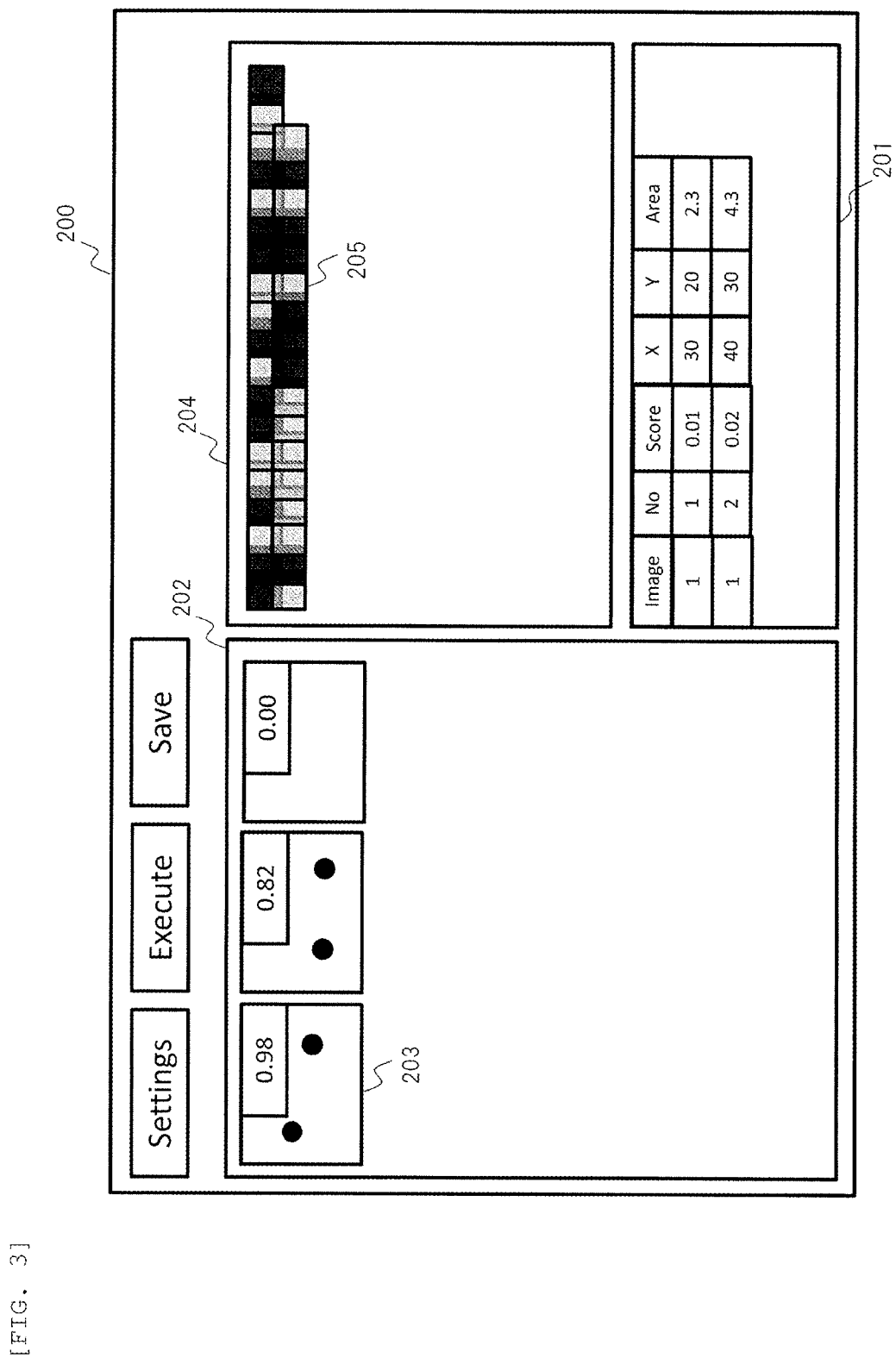

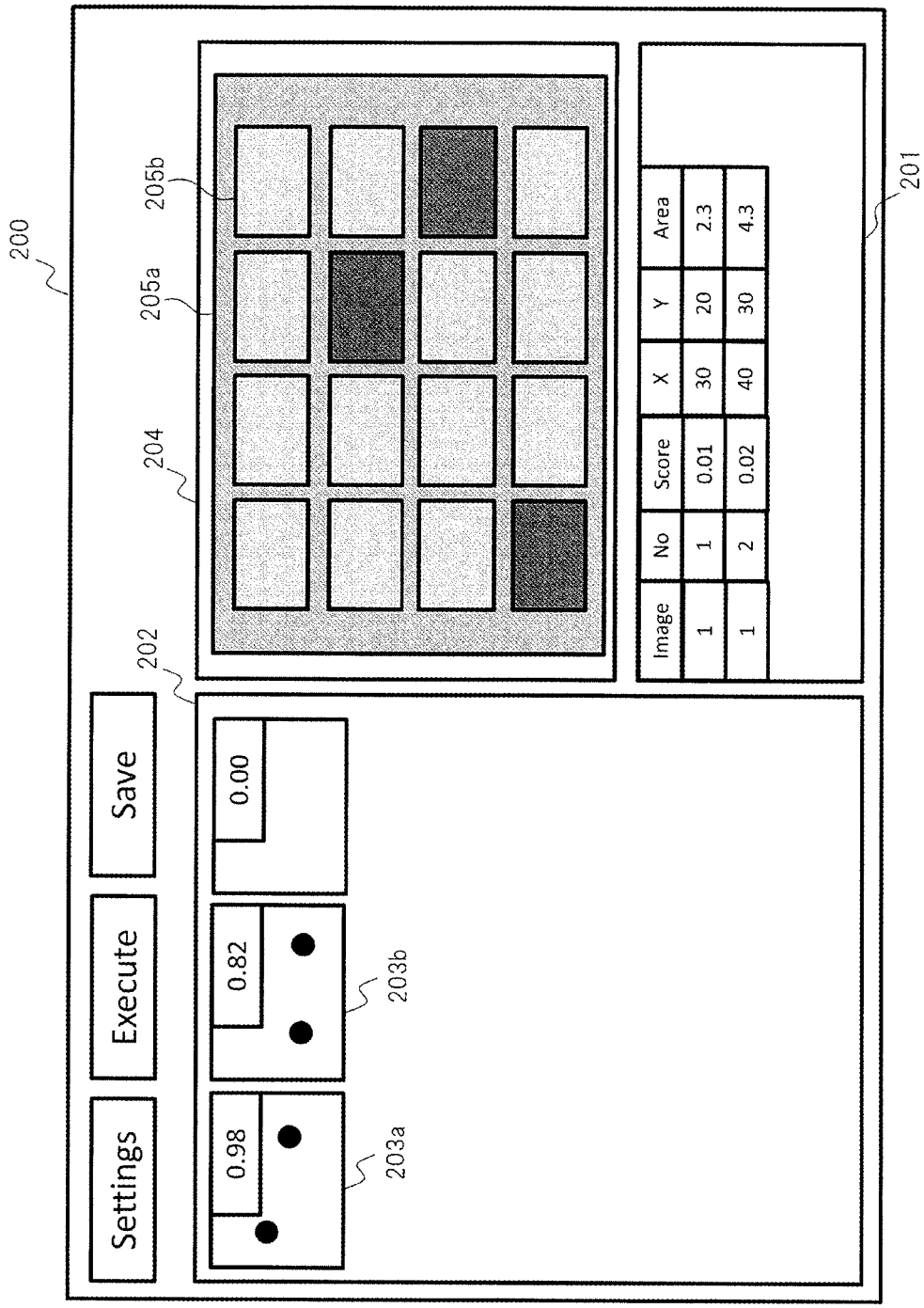
[FIG. 4]

[FIG. 5]
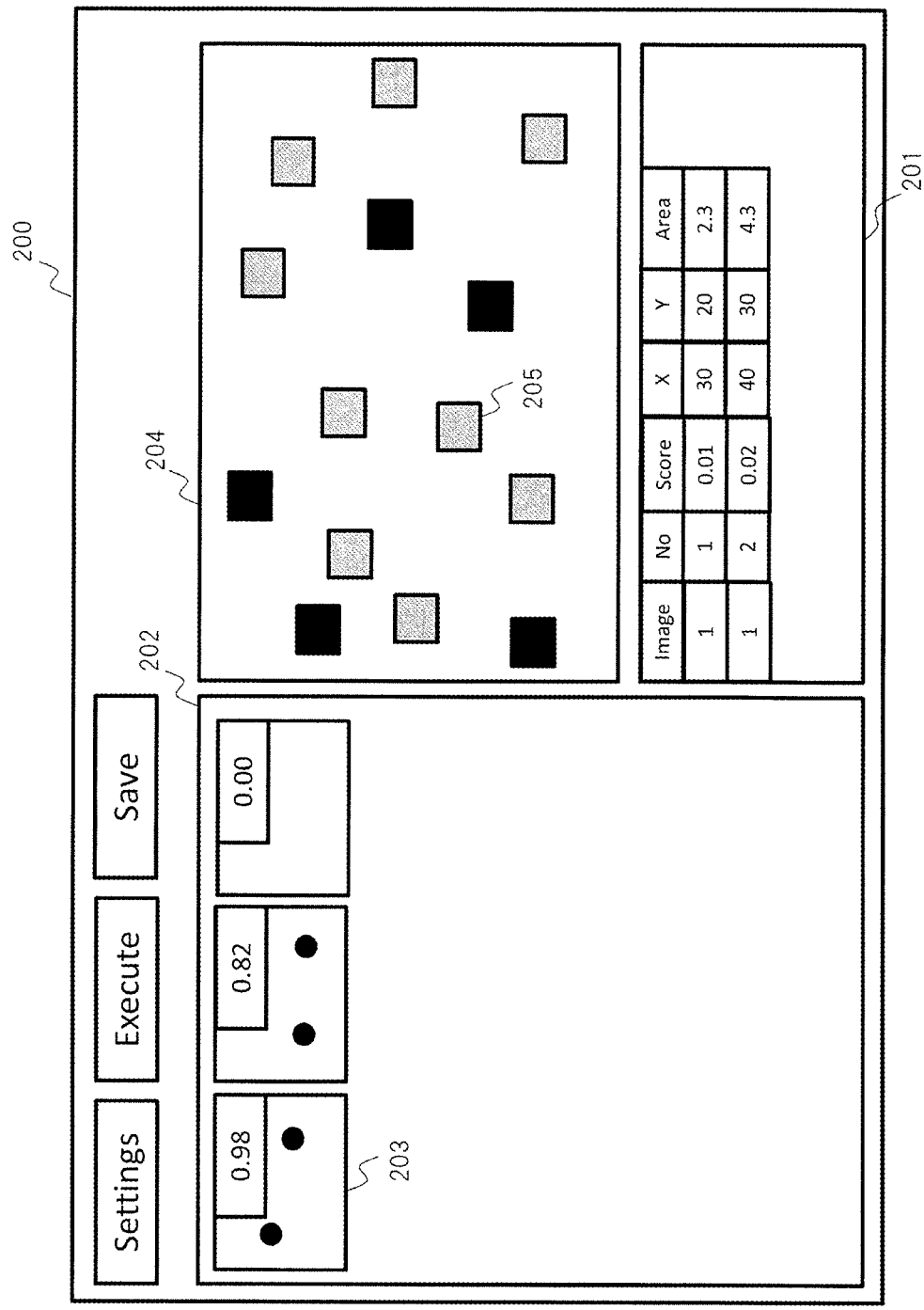

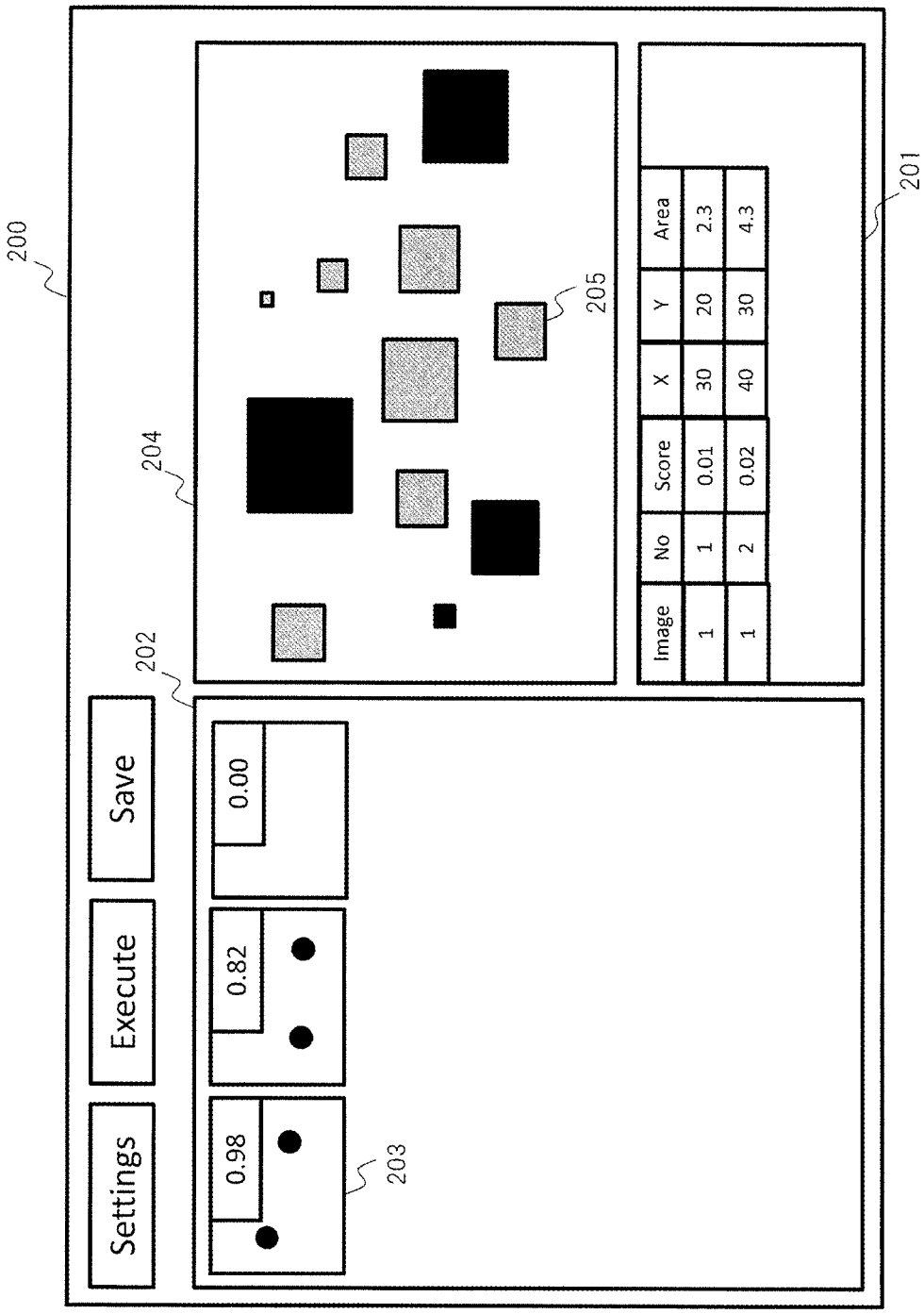
[FIG. 6]

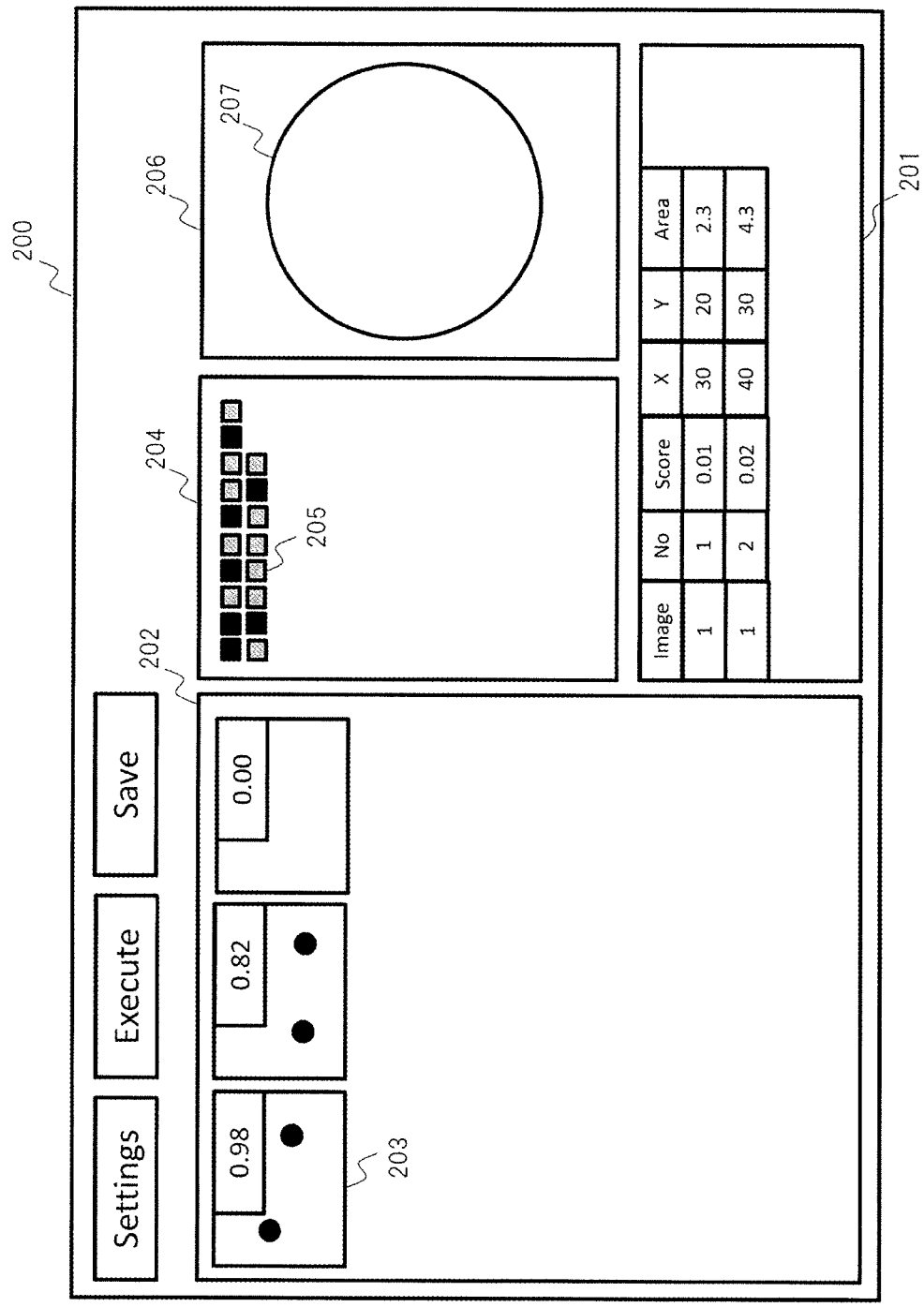
[FIG. 7]

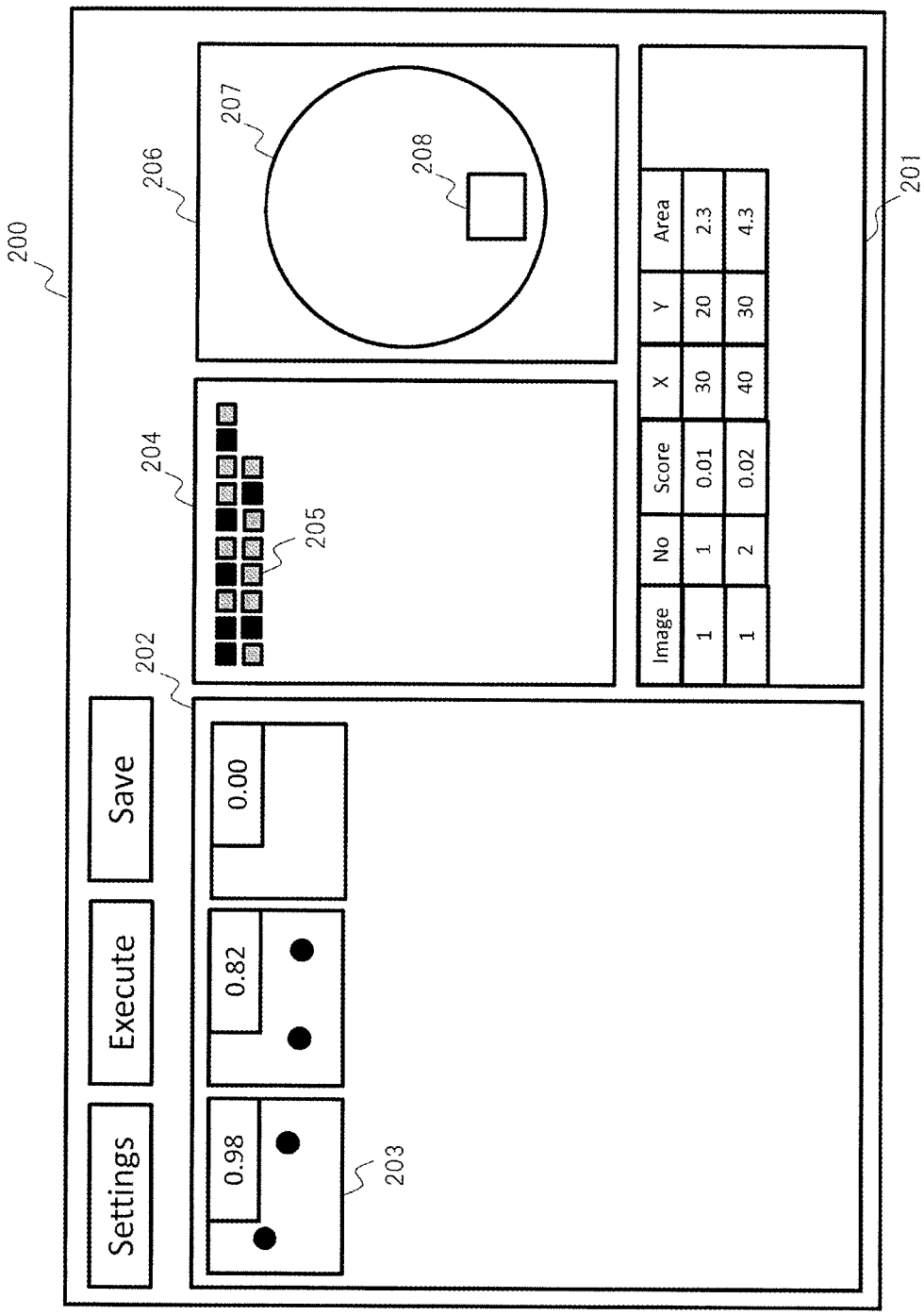
[FIG. 8]

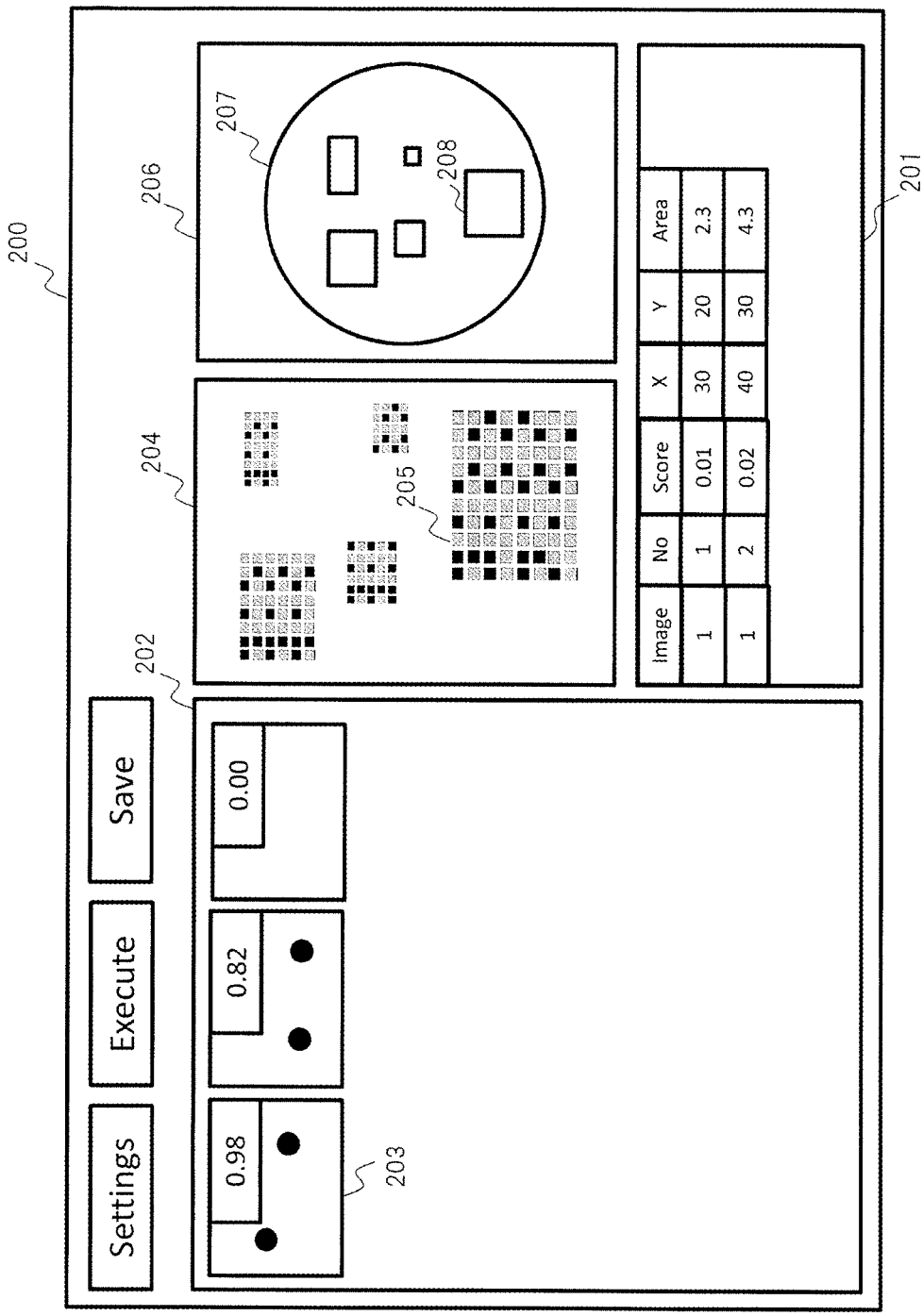

[FIG. 10]
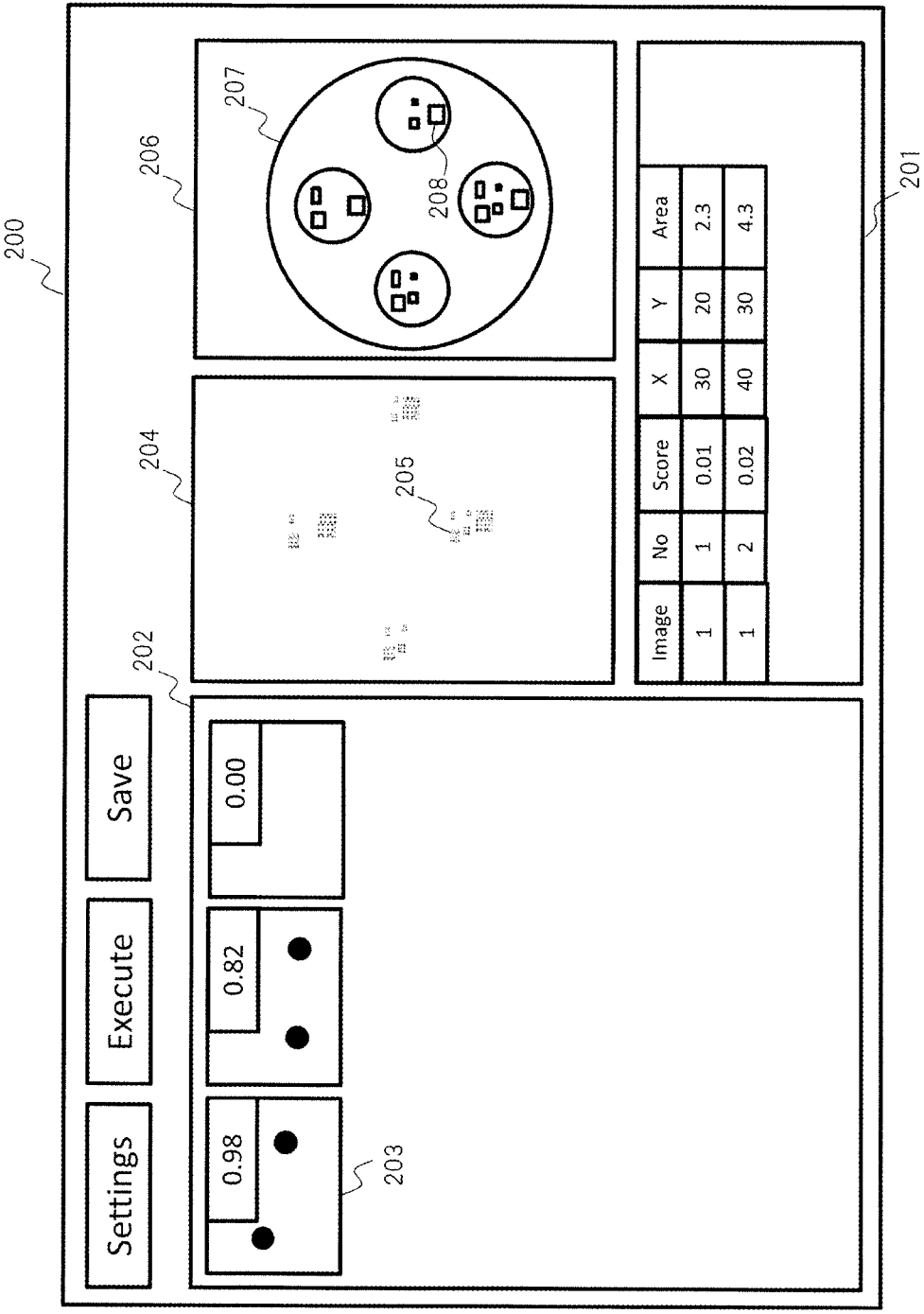

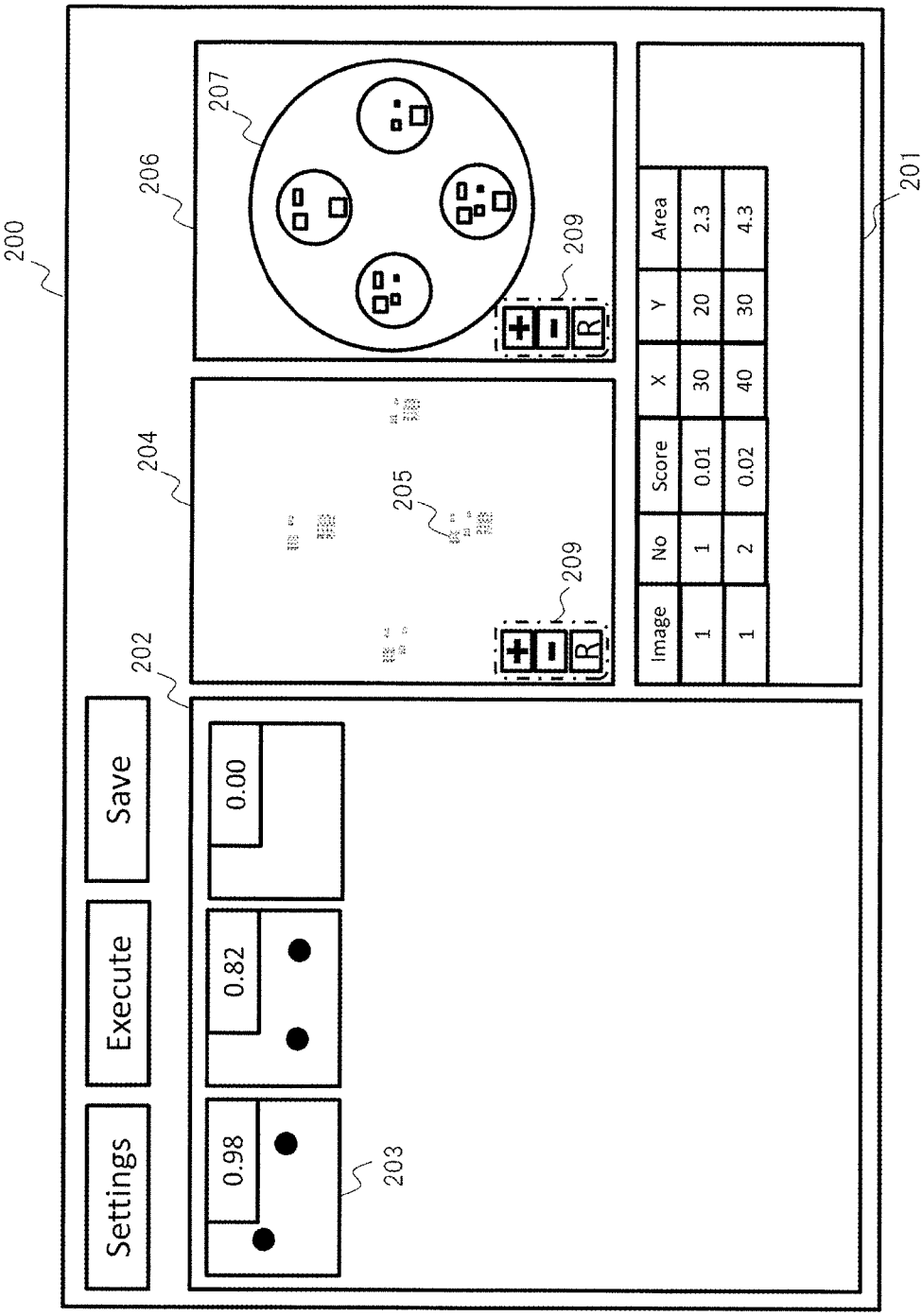
[FIG. 11]

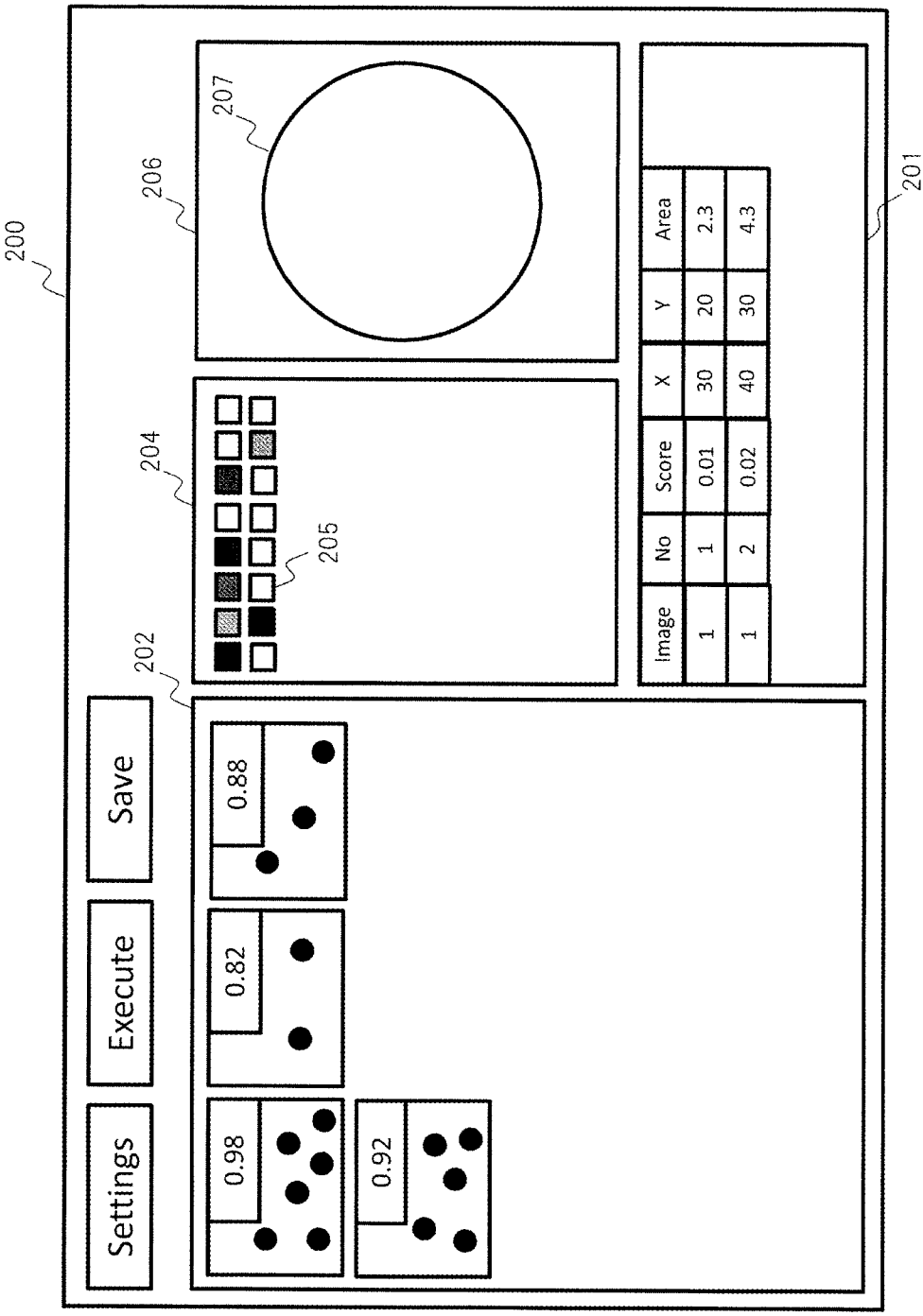
[FIG. 12]

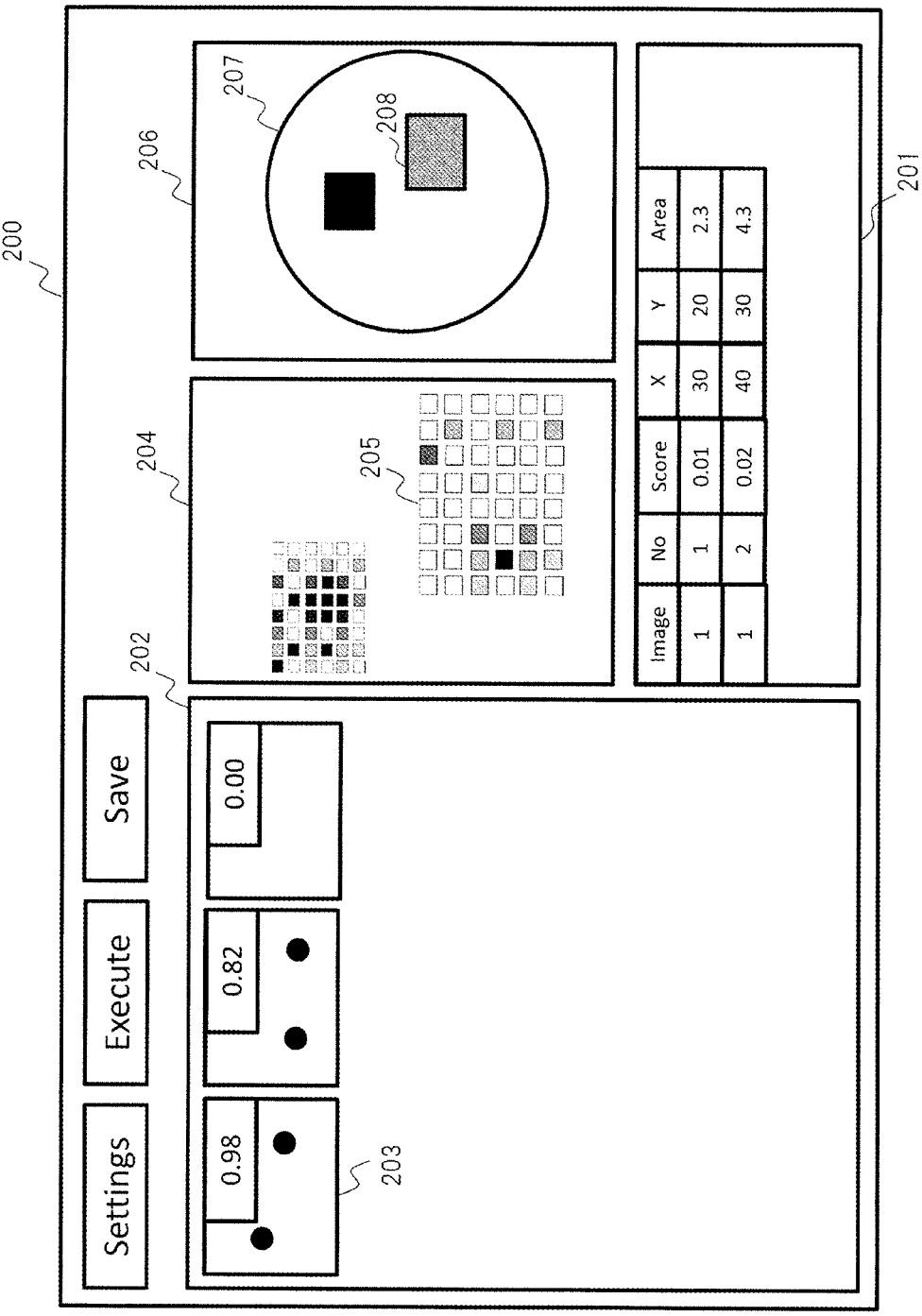
[FIG. 13]

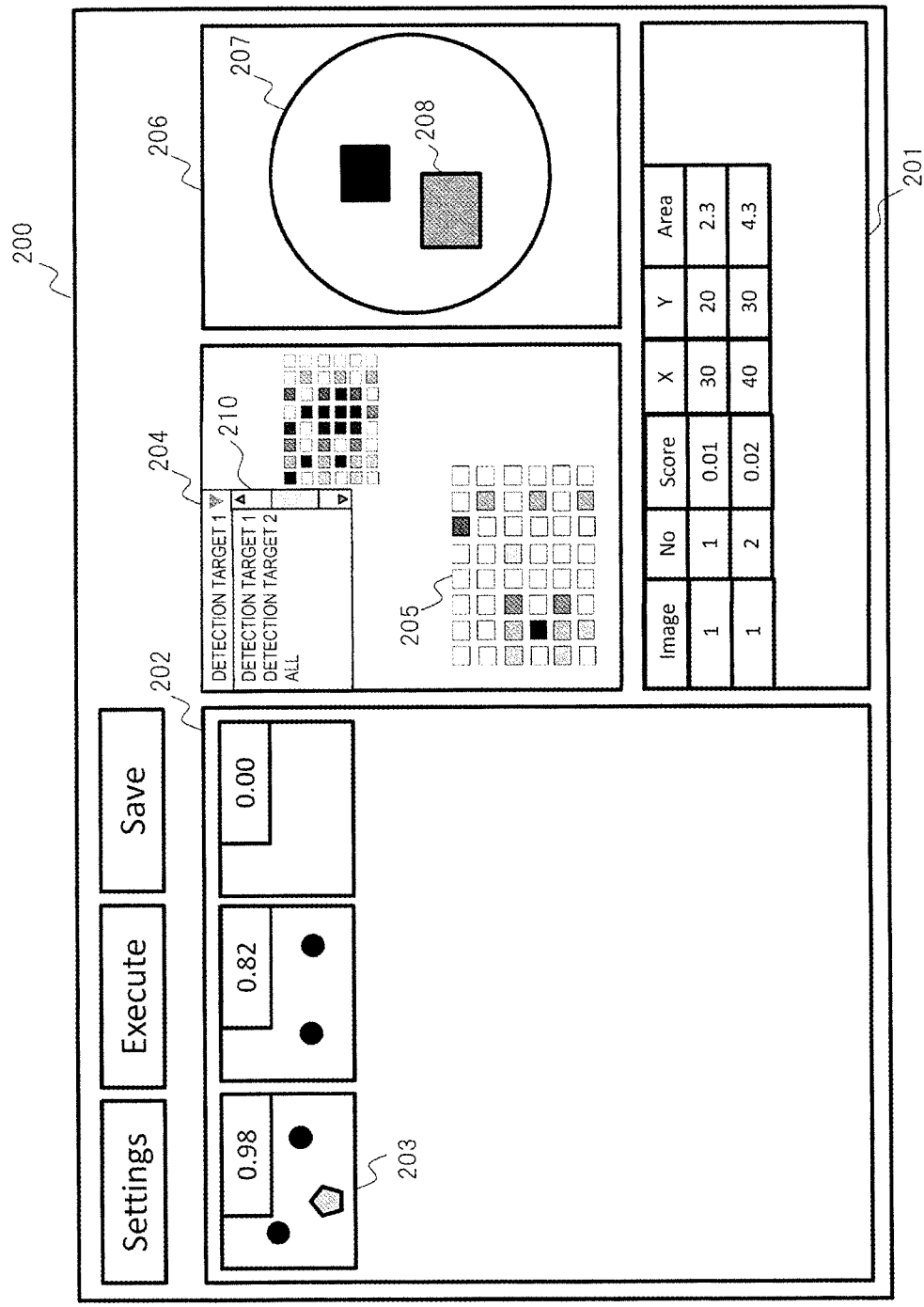
[FIG. 14]

SAMPLE IMAGE DISPLAY SYSTEM AND CHARGED PARTICLE BEAM APPARATUS

TECHNICAL FIELD

The present invention relates to a sample image display system and a charged particle beam device.

BACKGROUND ART

A sample image display system is used to display an image of a sample. The sample image display system can be configured as a part of a charged particle beam device. The charged particle beam device is used to detect and/or evaluate an object of interest in the sample. The charged particle beam device irradiates the sample with a charged particle beam, and detects and/or evaluates the object of interest by using a signal caused by the irradiation. An example of such a charged particle beam device is disclosed in PTL 1.

CITATION LIST

Patent Literature

PTL 1: JP-A-2019-60741

SUMMARY OF INVENTION

Technical Problem

In image analysis processing using artificial intelligence (AI), a large number of sample images can be processed in a short time. Therefore, a detection result display system and a charged particle beam device in the related art have a problem that a state of an object of interest is difficult to grasp at a glance when the large number of sample images are displayed.

The invention has been made to solve such a problem, and an object of the invention is to provide a sample image display system and a charged particle beam device capable of more easily grasping a state of an object of interest. The sample image display system also functions as, for example, a detection result display system.

Solution to Problem

An example of a sample image display system according to the invention is a sample image display system configured to display, on a screen, a plurality of images of a sample, and a symbol corresponding to each of the images, in which each of the symbols is displayed in a different mode according to information related to the corresponding image.

Advantageous Effect

According to the sample image display system and the charged particle beam device of the invention, a state of an entire sample can be easily grasped.

BRIEF DESCRIPTION OF DRAWINGS

FIG. 1 is a front view schematically showing a charged particle beam device according to a first embodiment of the invention.

FIG. 2 shows a display example in which a color of a symbol differs according to a detection result.

FIG. 3 shows a display example in which symbols corresponding to overlapping images are overlapped with each other.

FIG. 4 shows a display example in which a size of the symbol differs according to a magnification.

FIG. 5 shows another display example in which a position of the symbol differs according to a position of the image.

FIG. 6 shows another display example in which the size of the symbol differs according to the magnification.

FIG. 7 shows a display example including an optical image of a sample.

FIG. 8 shows a display example showing an imaging region.

FIG. 9 shows a display example showing a plurality of the imaging regions.

FIG. 10 shows a display example including a plurality of the optical images of the sample.

FIG. 11 shows a display example in which a display range can be changed.

FIG. 12 shows a display example in which transmittance of the symbol differs according to the detection result.

FIG. 13 shows a display example in which transmittance of the imaging region differs according to the detection result.

FIG. 14 shows a display example in which a display mode of the symbol can be switched according to the detection result.

DESCRIPTION OF EMBODIMENTS

Hereinafter, embodiments according to the invention will be described with reference to the drawings.

First Embodiment

<Configuration of Charged Particle Beam Device 100>

FIG. 1 is a front view schematically showing the charged particle beam device 100 according to the first embodiment. The charged particle beam device 100 is a scanning electron microscope. However, the charged particle beam device may be another charged particle beam device such as a transmission electron microscope or an ion beam device. It should be noted that a configuration of the charged particle beam device 100 is merely an example. In other words, a specific configuration of each part of the charged particle beam device 100 may vary according to a type or structure of the charged particle beam device 100.

The charged particle beam device 100 includes an irradiation unit 110 that irradiates a sample S with a charged particle beam. The irradiation unit 110 in this example includes an electron source 111 and a lens barrel 112. The electron source 111 emits electrons serving as a source of the charged particle beam (an electron beam in this example). The lens barrel 112 includes a focusing lens, a scanning coil, an objective lens, and the like, and guides the charged particle beam toward the sample S.

The irradiation unit 110 is connected to a sample chamber 120. Typically, the sample chamber 120 is evacuated by a vacuum pump (not shown) or the like.

In this example, a detection unit 130 that outputs a signal generated by irradiating the sample S with the charged particle beam is provided in the sample chamber 120. A target to be detected by the detection unit 130 may be secondary electrons, reflected electrons, X-rays, Auger electrons, or the like. Further, a plurality of the detection units 130 may be provided. In this example, the charged particle beam device 100 includes a first detection unit 130A that detects the secondary electrons and a second detection unit 130B that detects the X-rays. The detection unit 130 is not necessarily provided in the sample chamber 120. As an example, in a type of scanning electron microscope, the detection unit 130 is provided inside the lens barrel 112. As another example, in a type of transmission electron microscope, the detection unit 130 is provided downstream of a flow of the electron beam from the sample S so as to detect the electron beam transmitted through the sample S.

The charged particle beam device 100 includes a stage 140. The stage 140 may be a movable stage. Typically, the stage 140 may be movable in an X direction and/or a Y direction (one direction in a plane perpendicular to an optical axis of the charged particle beam: an arrow direction in FIG. 1). The stage 140 may be movable in a Z direction (a direction perpendicular to the optical axis of the charged particle beam). The stage 140 may be rotatable (rotation with the Z-axis direction as a rotation axis). Further, the stage 140 may be tiltable (rotation about the X direction or the Y direction as a rotation axis). The stage 140 may be configured to support a sample holder 141. In this example, the sample S is placed on the sample holder 141.

The charged particle beam device 100 may be connected to a control unit 151, an input unit 152, a storage unit 153, and a display unit 154. The control unit 151, the storage unit 153, and the display unit 154 constitute a sample image display system 150 according to the present embodiment. However, the sample image display system 150 may include other components, and may include, for example, the input unit 152.

The sample image display system 150 may constitute a part of the charged particle beam device 100 or a part of another device. The control unit 151, the input unit 152, the storage unit 153, and the display unit 154 may be a part of the charged particle beam device 100 or may be independent of the charged particle beam device 100. A connection between the respective units may be a wired connection or a wireless connection. Therefore, connection lines shown in FIG. 1 are merely examples. As an addition or alternative, a connection via a communication line such as internet can also be adopted. For example, the storage unit 153 may be a storage unit 153 on an intranet, the internet, or a cloud service. When the charged particle beam device 100 is connected to the control unit 151 or the storage unit 153 in a plurality of layers, the control unit 151 or the storage unit 153 in an upper layer may be referred to as an upper device.

In the typical charged particle beam device 100, the control unit 151 that has received a signal from the detection unit 130 can generate an image or a spectrum. Alternatively, the control unit 151 can analyze or evaluate a place or a region of the sample S irradiated with the charged particle beam (hereinafter, both are collectively referred to as "region" in the present specification). In this example, the 151 can generate an SEM image (here, a secondary electron image) based on a signal output by the first detection unit 130A. Similarly, the control unit 151 can generate an X-ray analysis image or a spectrum based on a signal output from the second detection unit 130B. Therefore, the control unit 151 functions as an image generation unit that generates an image of the sample S based on the output from the detection unit 130. Further, the control unit 151 can analyze or evaluate, for example, a surface shape or a surface element of the sample S based on these images or signals.

Input of information to the charged particle beam device 100 or output of information from the charged particle beam device 100 may be performed via a user interface (UI). In this example, the UI is a graphical user interface (GUI) and is displayed on the display unit 154.

In the control unit 151, control of the charged particle beam device 100, the generation of the image or the spectrum, or the analysis and evaluation of the sample S may be executed based on a learned model stored in the storage unit 153.

The control unit 151 may control operations of the entire charged particle beam device 100. The control unit 151 may implement this control by executing a program. This program may be stored in the storage unit 153 or may be stored in a storage section in the control unit 151 independent of the storage unit 153.

The charged particle beam device 100 may further include a navigation image capturing device 160. The navigation image capturing device 160 captures an optical image (navigation image) displayed on a navigation unit 206 (described later in relation to FIG. 7 and the like). In the example of FIG. 1, the navigation image capturing device 160 is provided in the sample chamber 120. In FIG. 1, when the stage 140 is located at a right end of an arrow in FIG. 1, the navigation image capturing device 160 can capture at least a part of a portion where the sample holder 141 is expected to be present. In the example of FIG. 1, the navigation image capturing device 160 is an optical camera, and can capture all portions where the sample holder 141 is expected to be present. A light source used for the navigation image capturing device 160 may be provided in the sample chamber 120.

Unlike the example of FIG. 1, an image acquisition section other than the optical camera may be used as the navigation image capturing device 160. In addition, unlike the example of FIG. 1, a navigation image capturing device 160 independent of the charged particle beam device 100 may be used. For example, an optical microscope that is independent of the charged particle beam device 100 and that is capable of fixing the sample holder 141 at a certain position and in a certain direction may be used as the navigation image capturing device 160. The navigation image capturing device 160 may also be connected to the control unit 151, the input unit 152, the storage unit 153, and the display unit 154.

<Regarding Contents of GUI>

FIG. 2 shows an example of the GUI displayed on the display unit 154. Such a GUI can be implemented as a screen 200 displayed on the display unit 154. The screen 200 includes a table format unit 201, an image display unit 202, and an image map unit 204. In the table format unit 201, an evaluation result of the sample S is displayed in a table format. In the example of FIG. 2, for each detected structure, an image number ("Image") corresponding to a region including the structure, a number ("No") specifying the structure among the structures included in the region, an evaluation result ("Score") regarding the structure, a position ("X" and "Y") of the structure, and an area ("Area") of the structure are displayed, whereas other evaluation results may be displayed.

In the image display unit 202, the evaluation result is displayed on the image 203 of the sample S in a superimposed manner. The portion where the evaluation result is displayed on the image 203 of the sample S in a superimposed manner can be optionally designed, and may be, for example, a circle, a rectangle, a polygon, or any other figure, a numerical value, a symbol, or a mark. The portion may have the same shape as a specific structure of the corresponding image 203. In this example, a plurality of the images 203 are displayed on the image display unit 202. The image 203 corresponds to, for example, a field of view when the charged particle beam device 100 performs imaging processing. A position of the specific structure detected in the image 203 is indicated by a black circle in a superimposed manner on each image 203. For each image 203, the evaluation result regarding each structure included in the image is displayed as a numerical value. Each image 203 is actually an image showing an appearance structure of the sample S and the like, but a content of the image itself is not particularly shown.

Symbols 205 corresponding to the respective images 203 are displayed on the screen 200. A portion where the symbol 205 is displayed on the screen 200 can be arbitrarily designed, but can be displayed on the image map unit 204, for example. The symbol 205 is a filled rectangle in the example of FIG. 2, but may be an unfilled frame, and may be another polygon, a circle, or any other figure, and may be a numerical value, a symbol, or a mark. Further, each symbol 205 may have the same shape as the corresponding image 203. In the example of FIG. 2, the image 203 and the symbol 205 are both rectangular.

In this manner, the sample image display system 150 according to the present embodiment displays the plurality of images 203 of the sample S and the symbols 205 corresponding to the respective images 203 on the screen. It is not necessary that the image 203 and the symbol 205 displayed on the screen 200 are all displayed in pairs at the same time. In the example of FIG. 2, only three of a large number of images acquired by the sample image display system are displayed as the image 203. Other images can be displayed, for example, in response to any image selection operation. The same applies to the symbol 205. Naturally, all the images 203 and the symbols 205 may be displayed in pairs at the same time.

The sample image display system 150 displays each symbol 205 in a different mode according to information related to the corresponding image 203. The "mode" means a color, a brightness, a fill pattern, hatching, transmittance, a size, a blinking pattern, a position, an angle or the like of the symbol 205. For example, the sample image display system 150 displays each symbol 205, according to the information related to the corresponding image 203, in a different color, a different brightness, a different fill pattern, different hatching, a different transmittance, a different size, a different blinking pattern, at a different angle, or at a different position.

The information related to the image 203 may include information representing the detection result in the image 203. In this case, the sample image display system 150 may display each symbol 205 in a different mode according to the detection result. The detection result includes, for example, the area, number, priority, and the like of a detection target structure detected in the image 203.

The detection target structure includes, for example, the shape of particles (spherical shape, specific crystal shape, etc.), the shape of foreign matter, the shape on sample S (scratch, etc.), and the like. The area, number, priority, and the like of the detection target structure can be acquired, for example, by image processing based on the image 203, or by inputting the image 203 into an appropriate learned model.

In the example of FIG. 2, the sample image display system 150 displays each symbol 205 in a different color according to the detection result. Specific examples of different colors are, for example, red and green, and in FIG. 2, these colors are represented by black and gray, respectively.

In the present specification, the term "color" includes an achromatic state (white, gray, and black). The expression "color is different" includes not only a case in which the color is different (for example, red and green) but also a case in which density, luminance, or brightness is different (for example, red and pink, or dark gray and light gray). The color may be represented by, for example, an RGB value specified for the display unit 154. In this case, pixels having different RGB values can be said to have different colors.

In this manner, since the sample image display system 150 according to the first embodiment displays each symbol 205 in a different mode according to the information related to the corresponding image 203 (for example, the detection result), a viewer can more easily grasp a state of the entire sample S without individually observing the image 203 in detail. For example, in the example of FIG. 2, by making a display mode (color in the example of FIG. 2) of the symbol 205 different according to the detection result, the state of the entire sample S can be easily grasped.

FIG. 3 shows another example of the GUI displayed on the display unit 154. The information related to the image 203 may include information representing a position or an angle of the image 203 with respect to the sample S. The position of the image 203 with respect to the sample S can be determined based on, for example, a position and an orientation of the stage 140 when the image 203 is acquired (imaged), an irradiation direction or an irradiation range of the charged particles, an image shift amount, and the like. The angle of the image 203 with respect to the sample S can be determined, for example, based on a rotation angle of the stage 140, raster rotation, and the like when the image 203 is acquired (imaged). In this case, the sample image display system 150 may display each symbol 205 at a different position on the screen according to the position of the corresponding image 203, and/or may display each symbol 205 at a different angle on the screen according to the angle of the corresponding image 203.

When there are regions of the sample S that overlap with each other in the plurality of the images 203, the sample image display system 150 displays the symbols 205 corresponding to the respective images 203 including the regions that overlap with each other in an overlapping manner, as shown in FIG. 3. In this manner, by making a position of the symbol 205 different according to the position of the image 203 and overlapping the symbols 205 in the overlapping region, the viewer can more easily grasp the position of each image 203.

FIG. 4 shows another example of the GUI displayed on the display unit 154. The information related to the image 203 may include information representing a magnification of the image 203. In this case, the sample image display system 150 may display each symbol 205 in a different size according to the magnification. The magnification means, for example, an enlargement ratio when the image is acquired. In the example of FIG. 4, a symbol 205a corresponding to a high-magnification image 203a is displayed small, and a symbol 205b corresponding to a low-magnification image 203b is displayed large. Alternatively, for example, a relative size between the symbols 205 may be determined according to a relative size between the images 203.

In this manner, by making a size of the symbol 205 different according to the magnification, the viewer can easily grasp not only a positional relation between the images 203 but also a magnitude relation of the specific structure of each image 203.

Also in the example of FIG. 4, the position of each symbol 205 is determined according to the position of the image 203 with respect to the sample S. The symbol 205 corresponding to each image 203 including the regions that overlap with each other is displayed in an overlapping manner.

When the plurality of symbols 205 overlap each other as shown in FIGS. 3 and 4, a method for determining a display order thereof can be appropriately designed. For example, the symbol 205 corresponding to the newer image 203 may be displayed on an upper side, the smaller symbol 205 may be displayed on the upper side, or a combination thereof may be displayed.

FIG. 5 shows another example of the GUI displayed on the display unit 154. In this example, as in FIG. 3, each symbol 205 is displayed at a different position on the screen according to the position of the corresponding image 203 of the sample S. The position where each image 203 is displayed on the image display unit 202 may be determined based on a specific order (for example, an order in which the image 203 is acquired) regardless of the position of the image 203 of the sample S.

In this manner, the images 203 can be arranged by efficiently using the screen (in other words, in an array format), and the symbols 205 can be arranged so that the positional relation of each image 203 can be easily grasped. FIG. 6 shows another example of the GUI displayed on the display unit 154. In this example, as in FIG. 3, each symbol 205 is displayed at a different position according to the position of the corresponding image 203. Further, as in FIG. 4, each symbol 205 is displayed in a different size according to the magnification of the corresponding image 203.

FIG. 7 shows another example of the GUI displayed on the display unit 154. The sample image display system 150 may further display an optical image 207 related to an appearance of the sample S. The optical image 207 is an image for visually specifying a search range in the sample S placed on the sample holder 141 by a user, and is typically captured by the navigation image capturing device 160. However, if an observation magnification of the charged particle beam device 100 can be set to be sufficiently low, an image such as an SEM image may be used as the optical image 207. Hereinafter, the optical image 207 will be described as an example, but the same can be performed when the SEM image or another image is used instead of the optical image 207.

The optical image 207 may include a region corresponding to the plurality of images 203, and may include a region corresponding to all the images 203. The optical image 207 is displayed, for example, on the navigation unit 206. The navigation unit 206 can be used, for example, to set or display a search region of the sample S to be searched by the charged particle beam device 100.

The optical image 207 is an optical image of the entire sample S in the example of FIG. 7, but if a plurality (or all) of regions corresponding to the image 203 are included, the optical image 207 may be an optical image of only a part of the sample S. Here, "all images 203" means all images 203 stored in the sample image display system 150 in one example, but in another example, "all images 203" may mean all images 203 displayed on the screen 200 at that time.

In this manner, by displaying the optical image 207 of the sample S, the viewer can more easily grasp the state of the entire sample S.

FIG. 8 shows another example of the GUI displayed on the display unit 154. The sample image display system 150 may display information indicating an imaging region 208 in the optical image 207. The imaging region 208 includes the region corresponding to the image 203 in the sample S, and each image 203 (more strictly, the region corresponding to each image 203 in the sample S) belongs to the imaging region 208. In the example of FIG. 8, the information indicating the imaging region 208 is displayed in a rectangular frame, but the shape of the frame is not limited to a rectangle, and may be any shape such as a polygon, a circle, and an amorphous shape as long as the shape defines a closed area. Further, the information indicating the imaging region 208 is not limited to the frame, and may be displayed by a mark, or may be displayed by changing a color or other display modes in the region.

In the example of FIG. 8, a single imaging region 208 is shown, but the imaging region 208 may be separated into a plurality of the imaging regions 208, and in this case, each image 203 belongs to any one of the plurality of imaging regions 208.

In the example of FIG. 8, the information related to the image 203 may include information indicating the position of the image 203 with respect to the sample S. In this case, which imaging region 208 each image 203 belongs can be determined based on the information indicating the position of the image 203 with respect to the sample S and information indicating a position of the imaging region 208 with respect to the sample S (or with respect to the optical image 207 of the sample S).

In this manner, by displaying the information indicating the imaging region 208, the viewer can more easily grasp which part of the sample S the image 203 is displayed.

FIG. 9 shows another example of the GUI displayed on the display unit 154. In this example, the sample image display system 150 displays a plurality of the imaging regions 208 in the optical image 207. Further, in this example, each symbol 205 is displayed at a different position on the screen according to the position of the corresponding image 203 of the sample S.

As a result, the symbols 205 corresponding to the images 203 belonging to a certain imaging region 208 are collectively displayed in a specific region. Therefore, the viewer can more easily grasp the state of the entire sample S.

In the example of FIG. 9, the plurality of imaging regions 208 are displayed, but the imaging region 208 may be singular as shown in FIG. 8.

FIG. 10 shows another example of the GUI displayed on the display unit 154. The sample image display system 150 may display images of a plurality of the samples S arranged on the stage 140. For example, the optical image 207 may represent the plurality of samples S. In this case, the information related to the image 203 may include the information indicating the position of the image 203 with respect to the stage 140. As an example of such information, a coordinate (for example, the position and the orientation) of the stage 140 when the image 203 is acquired by the charged particle beam device 100 can be used.

The sample image display system 150 may display each symbol 205 at a different position on the screen 200 according to the position of the image 203. In the example of FIG. 10, each symbol 205 is displayed at a different position on the screen according to the position of the corresponding image 203 on the stage 140. Also in the example of FIG. 10, the plurality of imaging regions 208 are displayed.

As a result, the symbols 205 corresponding to the images 203 related to the sample S are collectively displayed in the specific region corresponding to the sample S. Therefore, the viewer can more easily grasp the state of each entire sample S.

FIG. 11 shows another example of the GUI displayed on the display unit 154. The sample image display system 150 may change a display position of each symbol 205 according to the display range changing operation. The sample image display system 150 may further change the size of each symbol 205. The display range changing operation can be input via, for example, a display range changing unit 209.

For example, when a "+" button is operated, the sample image display system 150 expands a display in the image map unit 204 accordingly. According to the enlargement process, display positions of the symbols 205 are changed so as to be separated from each other, and the sizes are enlarged. When a "−" button is operated, the sample image display system 150 reduces the display in the image map unit 204 accordingly. According to the reduction process, the display positions of the symbols 205 are changed so as to be close to each other, and the sizes are reduced. When an "R" button is operated, the sample image display system 150 resets the display in the image map unit 204 accordingly. The display position and size of each symbol 205 are reset according to the reset process.

In this example, both the display position and the size of the symbol 205 change according to the display range changing operation, but only the display position may be changed. For example, when the display range changing operation is a drag operation in the image map unit 204, the display position of each symbol 205 may be changed according to the operation.

Such a change in the display range may be accepted only for the image map unit 204, or may be similarly received for the navigation unit 206. In the example of FIG. 11, the display range changing unit 209 is also provided in the navigation unit 206, and a display range of the navigation unit 206 can also be changed.

In this manner, when the display range can be freely changed in accordance with the operation, the viewer can display a desired range in a desired size.

FIG. 12 shows another example of the GUI displayed on the display unit 154. The sample image display system 150 may display each symbol 205 with a different transmittance according to the detection result.

In the present specification, the term "transmittance" means, for example, how much an original display content is displayed when the symbol 205 is displayed in an overlapping manner with a certain display content. More specifically, when the red symbol 205 overlaps with a white background, the symbol 205 is displayed in red if the transmittance is low, and the symbol 205 is displayed in light pink if the transmittance is high.

Even when a part or all of the plurality of symbols 205 are displayed in an overlapping manner as shown in FIGS. 3 and 4, the display based on the transmittance may be performed. In this case, the higher the transmittance of the symbol 205 arranged on the upper side (or the higher display layer of the display priority) is, the more clearly the content of the symbol 205 arranged below (or the lower display layer of the display priority) appears.

Alternatively, any one of the symbols 205 may be preferentially displayed for the overlapping portion. In this case, the content of the symbol 205 that is not prioritized is not displayed for the overlapping portion.

In this manner, by making the transmittance of the symbol 205 different according to the detection result, the viewer can more easily grasp the state of the entire sample S.

FIG. 13 shows another example of the GUI displayed on the display unit 154. In this example, the information related to the image 203 includes the information indicating the detection result in the image 203. The sample image display system 150 displays the information indicating the imaging region 208 in a different mode according to the detection result in each image 203 belonging to the imaging region 208. In the example of FIG. 13, two imaging regions 208 are displayed in different colors.

As a more specific example, when the detection result is acquired as a numerical value (for example, an area of the specific structure in the image 203), the detection result in the imaging region 208 may be calculated by summing or arithmetic averaging all the detection results of all the images 203 belonging to the imaging region 208, and the display mode of the information indicating the imaging region 208 may be determined based on the detection result.

In this manner, by making the display mode of the information indicating the imaging region 208 different according to the detection result, the viewer can more easily grasp the state of the entire sample S.

FIG. 14 shows another example of the GUI displayed on the display unit 154. The information related to the image 203 may include information representing a plurality of the detection results in the image 203. In the example of FIG. 14, a first detection result is a detection result related to the detection target structure represented by a black circle, and a second detection result is a detection result related to the detection target structure represented by a gray pentagon. The sample image display system 150 may switch, in accordance with the detection result switching operation, whether to display each symbol 205 in a different mode according to the first detection result, to display in a different mode according to the second detection result, or to simultaneously display two different modes according to both the first detection result and the second detection result.

The detection result switching operation can be input via, for example, a detection target selection unit 210. In this example, the detection target selection unit 210 is configured as a pull-down list. When a first detection target is selected in the detection target selection unit 210, the sample image display system 150 displays each symbol 205 in a different mode according to the first detection result. For example, when a large number of detection target structures represented by black circles are detected in a certain image 203, the corresponding symbol 205 is displayed in red, and when the detection target structure represented by the black circle is not detected, the corresponding symbol 205 is displayed in green.

Meanwhile, when a second detection target is selected in the detection target selection unit 210, the sample image display system 150 displays each symbol 205 in a different mode according to the second detection result. For example, when a large number of detection target structures represented by gray pentagons are detected in a certain image 203, the corresponding symbol 205 is displayed in red, and when the detection target structure represented by the gray pentagon is not detected, the corresponding symbol 205 is displayed in green.

In this manner, by allowing a detection target to be freely selected, the viewer can independently grasp the state of the entire sample S for each of the plurality of types of detection target structures.

As described above, the sample image display system 150 according to the first embodiment displays each symbol 205 in a different mode according to the information related to the corresponding image 203, so that the viewer can more easily grasp the state of the entire sample S without having to observe the images 203 in detail individually.

In particular, when a large number of images 203 are acquired by the charged particle beam device 100, such an effect can be achieved more remarkably.

<Other Operations of Charged Particle Beam Device 100>

The charged particle beam device 100 may analyze the sample S in a region corresponding to the selected symbol 205 or image 203 of the sample S according to an operation of selecting the symbol 205 or the image 203. The number of the symbol 205 or the image 203 to be selected may be one or more. The user of the charged particle beam device 100 can select the symbol 205 or the image 203 by clicking the symbol 205 or the image 203 on the screen 200 shown in FIG. 2 or the like.

The analysis of the sample S may include shape analysis or composition analysis. For example, a region corresponding to the selected image 203 may be further irradiated with the charged particle beam via the irradiation unit 110, and the signal caused by the irradiation may be detected via the detection unit 130.

The signal related to the analysis may be, for example, a signal based on the electrons generated when the sample S is irradiated with the charged particle beam, or a signal based on the X-rays generated when the sample S is irradiated with the charged particle beam. In particular, when the detection of each structure is executed by the signal based on electrons and the analysis of each structure is executed by the signal based on the X-rays, the search can be efficiently executed and the analysis can be executed with high accuracy. For the analysis, for example, high-magnification capturing using energy dispersive X-ray spectroscopy (EDS) or electron backscatter diffraction (EBSD) can be used. A charged particle beam with high acceleration or a large current may be used in capturing.

REFERENCE SIGN LIST

100 charged particle beam device
110 irradiation unit
111 electron source
112 lens barrel
120 sample chamber
130 detection unit
140 stage
141 sample holder
150 sample image display system
151 control unit (image generation unit)
152 input unit
153 storage unit
154 display unit
160 navigation image capturing device
200 screen
201 table format unit
202 image display unit
203, 203a, 203b image
204 image map unit
205, 205a, 205b symbol
206 navigation unit
207 optical image (image)
208 imaging region
209 display range changing unit
210 detection target selection unit
130A first detection unit
130B second detection unit
S sample

The invention claimed is:

1. A sample image display system configured to display, on a screen,
a plurality of images of a sample, and
a symbol corresponding to each of the images, wherein
each of the symbols is configured to be displayed in a different mode according to a detection result related to the corresponding image, and
each of the symbols is configured to be displayed in a different color according to the detection result.

2. The sample image display system according to claim 1, wherein
the information related to the image includes information indicating a first detection result in the image and information indicating a second detection result in the image, and
switching between displaying of each of the symbols in a different mode according to the first detection result or displaying of each of the symbols in a different mode according to the second detection result is configured to be made according to a detection result switching operation.

3. The sample image display system according to claim 1, wherein
the information related to the image includes information indicating a position, and
each of the symbols is configured to be displayed at a different position on the screen according to the position of the image.

4. The sample image display system according to claim 3, wherein
a display position of each of the symbols is configured to be changed according to a display range changing operation.

5. The sample image display system according to claim 3, wherein
when there are image regions of the sample that overlap with each other in the plurality of the images, the symbols corresponding to the image regions of the sample that overlap with each other are configured to be displayed in an overlapping manner.

6. The sample image display system according to claim 1 configured to further display an image of the sample including a region corresponding to all the images.

7. The sample image display system according to claim 6, wherein
each of the images belongs to any one of one or more imaging regions with respect to the sample, and
information indicating the imaging region is configured to be displayed in the image including the region corresponding to all the images.

8. The sample image display system according to claim 7, wherein
each of the images belongs to any one of a plurality of the imaging regions with respect to the sample,
the information related to the image includes information indicating a position of the image with respect to the sample, and
each of the symbols is configured to be displayed at a different position on the screen according to the position of the image.

9. The sample image display system according to claim 8, wherein
the information related to the image includes information indicating a detection result in the image, and
information indicating the imaging region is configured to be displayed in a different mode according to the detection result in each of the images belonging to the imaging region.

10. The sample image display system according to claim 1, wherein a plurality of images of a sample arranged on a stage are configured to be displayed, the information related to the images includes information indicating a position of the image with respect to the stage, and each of the symbols is configured to be displayed at a different position on the screen according to the position of the image.

11. A charged particle beam device, comprising:
the sample image display system according to claim 1;
an irradiation unit configured to irradiate the sample with a charged particle beam;
a detection unit configured to detect a signal caused by irradiation of the charged particle beam to the sample; and
an image generation unit configured to generate the image of the sample based on an output from the detection unit.

12. A sample image display system configured to display, on a screen,
a plurality of images of a sample, and
a symbol corresponding to each of the images, wherein
each of the symbols is configured to be displayed in a different mode according to a detection result related to the corresponding image, and
each of the symbols is configured to be displayed at a different transmittance according to the detection result.

13. The sample image display system configured to display, on a screen,
a plurality of images of a sample, and
a symbol corresponding to each of the images, wherein
each of the symbols is configured to be displayed in a different mode according to a detection result related to the corresponding image, and
the information related to the image includes information indicating a magnification of the image, and
each of the symbols configured to be displayed in a different size according to the magnification.

* * * * *